(12) United States Patent
Ushiyama

(10) Patent No.: US 6,480,073 B2
(45) Date of Patent: Nov. 12, 2002

(54) METHOD OF EVALUATING QUALITY OF CRYSTAL UNIT

(75) Inventor: Hajime Ushiyama, Nagano (JP)

(73) Assignee: Suwadenshi Co., Ltd., Nagano (JP)

( * ) Notice: Subject to any disclaimer, the term of this patent is extended or adjusted under 35 U.S.C. 154(b) by 7 days.

(21) Appl. No.: 09/764,456

(22) Filed: Jan. 19, 2001

(65) Prior Publication Data

US 2001/0020874 A1 Sep. 13, 2001

(30) Foreign Application Priority Data

Mar. 1, 2000 (JP) .......................................... 2000-056475

(51) Int. Cl.[7] .............................. H03B 5/36; G01R 29/22
(52) U.S. Cl. .......................... 331/158; 331/44; 331/161; 324/727
(58) Field of Search ................................. 331/44, 116 R, 331/116 FE, 158, 161, 175, 177 R, 185, 186; 324/652, 727

(56) References Cited

U.S. PATENT DOCUMENTS 5,959,505 A * 9/1999 Ushiyama .................... 331/158

* cited by examiner

*Primary Examiner*—David Mis
(74) *Attorney, Agent, or Firm*—Wenderoth, Lind & Ponack, L.L.P.

(57) ABSTRACT

A method of evaluating quality of a crystal unit, capable of performing quantitative measurement of an actual operation of a crystal unit which is to be oscillated in an actual oscillator to ensure an accurate quality evaluation, is provided. The method includes increasing a DC input voltage of a crystal oscillator, the crystal oscillator having at least one AGC amplifier whose amplification rate varies depending on the DC input voltage and having a crystal unit connected thereto, measuring a maximum value of the DC input voltage at a start of oscillation of the crystal oscillator, and evaluating quality of the crystal unit by the measured maximum value.

20 Claims, 5 Drawing Sheets

METHOD OF EVALUATING QUALITY OF CRYSTAL UNIT

BACKGROUND OF THE INVENTION

1. Field of the Invention

The present invention relates to a method of evaluating quality of a crystal unit, and more specifically, to a novel method capable of an accurate quality evaluation of a crystal unit.

2. Description of the Related Art

Conventionally, for quality evaluation of a crystal unit, there is used a method using a network analyzer (hereinafter referred to as a network analyzer method). In this network analyzer method, a crystal unit is considered as a passive element constituted of inductance L, capacitance C, resistance R, and a serial resonance frequency and a serial resonance resistance CI (crystal impedance) of the crystal unit is obtained by giving an AC signal thereto, and then the quality of the crystal unit is evaluated from the resultant magnitude of the CI.

However, in the network analyzer method, parameters such as CI are measured under a condition in which the crystal unit is oscillated in a stable state by the externally given signal without evaluating any transient state at the start of the oscillation in an actual oscillator. This causes a problem that a crystal unit evaluated as having good quality by the network analyzer method does not oscillate often in an actual oscillator in which the oscillation is not always in a stable state.

SUMMARY OF THE INVENTION

In view of the foregoing, it is an object of the present invention to provide a novel method of evaluating quality of a crystal unit, capable of performing quantitative measurement of an actual operation of a crystal unit which is to be oscillated in an actual oscillator to ensure an accurate quality evaluation of the crystal unit.

Here, "the quality evaluation of crystal unit" means to evaluate whether the crystal unit has good or poor quality, in other words, whether the crystal unit is acceptable or unacceptable for practical use. "The crystal unit has good quality (or is acceptable)" means that in an actual oscillator, an oscillation starts normally and its frequency variation is little. Hereinafter, this crystal unit is referred to simply as "an acceptable crystal unit". "The crystal unit has poor quality (or is unacceptable)" means that in an actual oscillator, an oscillation does not start at all, or the value of CI or frequency variation is abnormally large due to variation in driving power. Hereinafter, this crystal unit is referred to simply as "an unacceptable crystal unit".

BRIEF DESCRIPTION OF THE DRAWINGS

The foregoing objects, features and advantages of the present invention will be better understood from the following detailed description, taken in conjunction with the accompanying drawings, in which.

DESCRIPTION OF THE PREFERRED EMBODIMENTS

Embodiment 1

Figure 1:
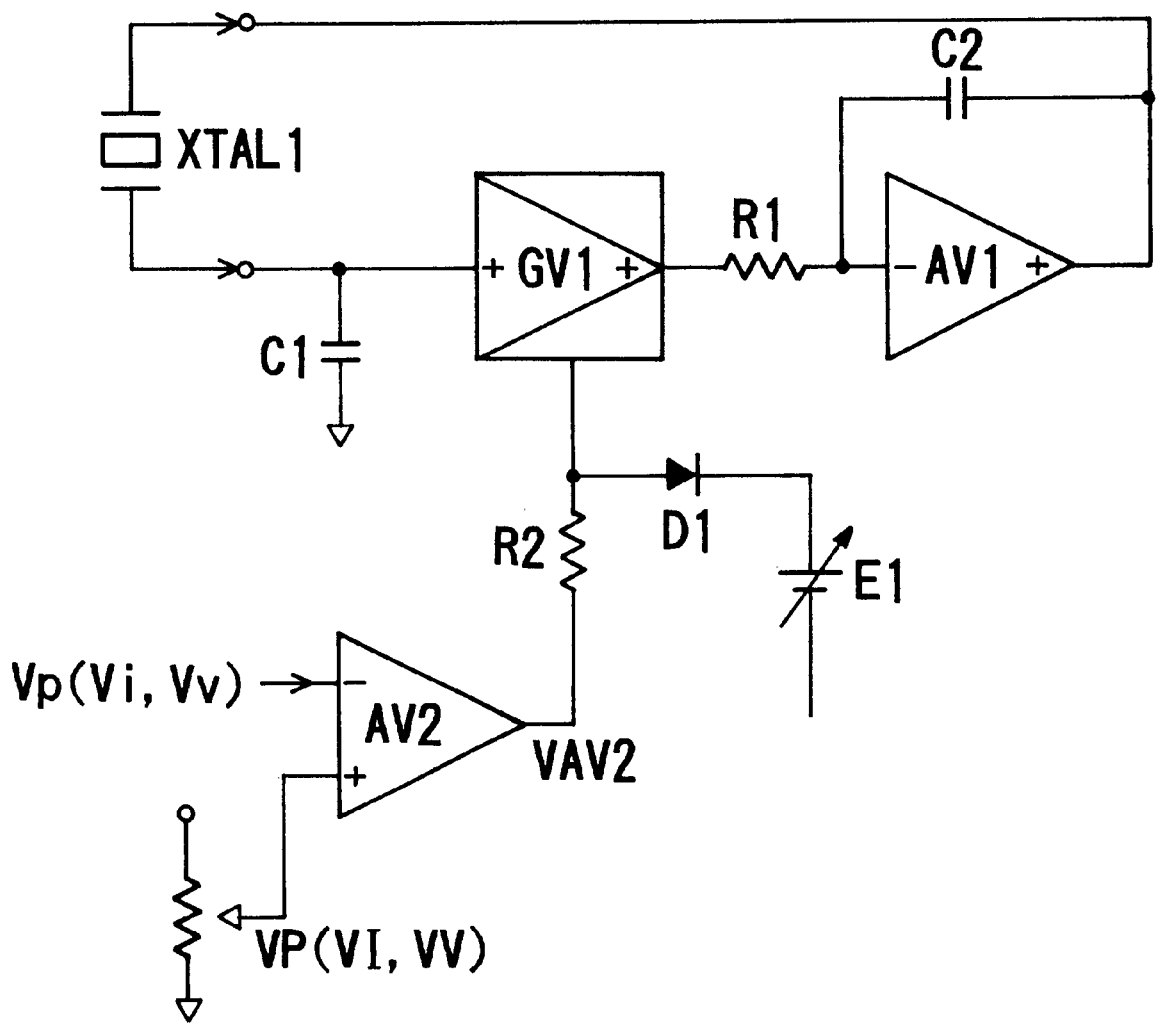
FIG. 1 is a diagram showing an example of a crystal oscillator used in a method of evaluating quality of a crystal unit according to the present invention.

FIG. 1 shows an example of a crystal oscillator used in the method of evaluating quality of a crystal unit according to the present invention.

In the crystal oscillator shown in FIG. 1; XTAL1 is a crystal unit to be evaluated; GV1 is an AGC (automatic gain control) amplifier whose amplification rate changes depending on a DC input voltage VAGC; C1 is an input capacitor of the crystal oscillator; R1, C2 and AV1 denote, respectively, a resistance, capacitor and high gain amplifier, together comprising an integrating circuit, wherein the AGC amplifier GV1 is connected to its input side; AV2 is an error amplifier for driving the crystal unit with a stabilized power (or a stabilized current, or a stabilized voltage); VAV2 is an output voltage from the error amplifier; VP(VI, VV) is a DC voltage for setting a driving power (or a driving current, or a driving voltage) of the crystal unit; D1 and E1 are a diode and a voltage source, both for setting the maximum voltage of the DC input voltage VAGC; and R2 is a voltage dividing resistor.

Vp(Vi, Vv) means that the DC voltage may be any one of DC voltages Vp, Vi and Vv proportional to a driving power, driving current and driving voltage of the crystal unit, respectively. VP(VI, VV) means that the DC voltage may be any one of DC voltages VP, VI and VV for setting a driving power, driving current and driving voltage of the crystal unit, respectively.

Figure 2:
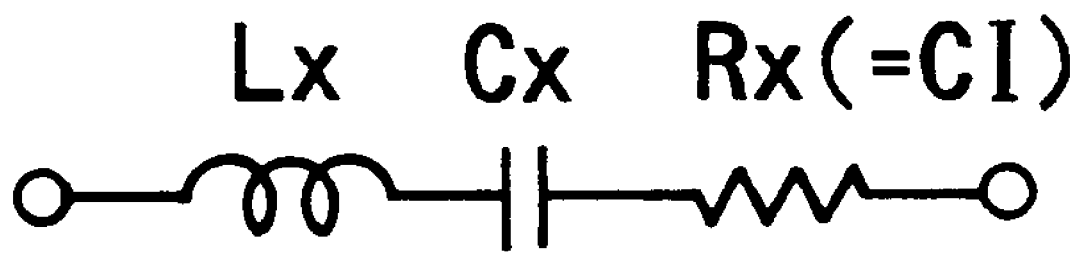
FIG. 2 is a diagram showing an example of an equivalent circuit of a crystal unit.

FIG. 2 shows an example of an equivalent circuit of the crystal unit. In FIG. 2, Lx, Cx and Rx denote, respectively, an equivalent serial resonance inductance, equivalent capacitance and equivalent resistance of the crystal unit, connected in series to each other.

As apparent from FIGS. 1 and 2, the condition of continuous oscillation of the crystal oscillator having at least one AGC amplifier whose amplification rate changes depending on the DC input voltage VAGC, can be denoted by the following equation with the equivalent resistance Rx of the crystal unit taken as CI.

$$CI = \frac{GV1}{\omega^2 \cdot C1 \cdot C2 \cdot R1}$$

where $$\omega = \frac{1}{\sqrt{Lx \cdot Cx}}\left(1 + \frac{1}{2} + \frac{Cx}{CI}\right)$$

In this equation, GV1 is the amplification rate of the AGC amplifier GV1 (hereinafter referred to simply as "the amplification rate GV1"), and CI is proportional to the amplification rate GV1. When the DC input voltage VAGC to the AGC amplifier is monotonously increasing in relation to the amplification rate GV1, the VAGC is not necessarily required to be proportional to the amplification rate GV1. Conversely, with the DC input voltage VAGC proportional to the amplification rate GV1, CI of the crystal unit is to be proportional to the DC input voltage VAGC when the oscillation in the crystal oscillator enters a stable state. In other words, with the AGC amplifier having the amplification rate GV1 being proportional to the DC input voltage VAGC, the DC input voltage VAGC can be measured as a value proportional to the CI of the crystal unit. This is the same for measurements of the DC input voltages VAGC in later described embodiments 2 to 4.

In the method of the present invention, using the crystal oscillator as shown in FIG. 1, the maximum value of the DC input voltage at a start of oscillation in the crystal oscillator is measured with the DC input voltage VAGC increased. From the measured maximum value, quality of a crystal unit can be evaluated.

Figure 3:
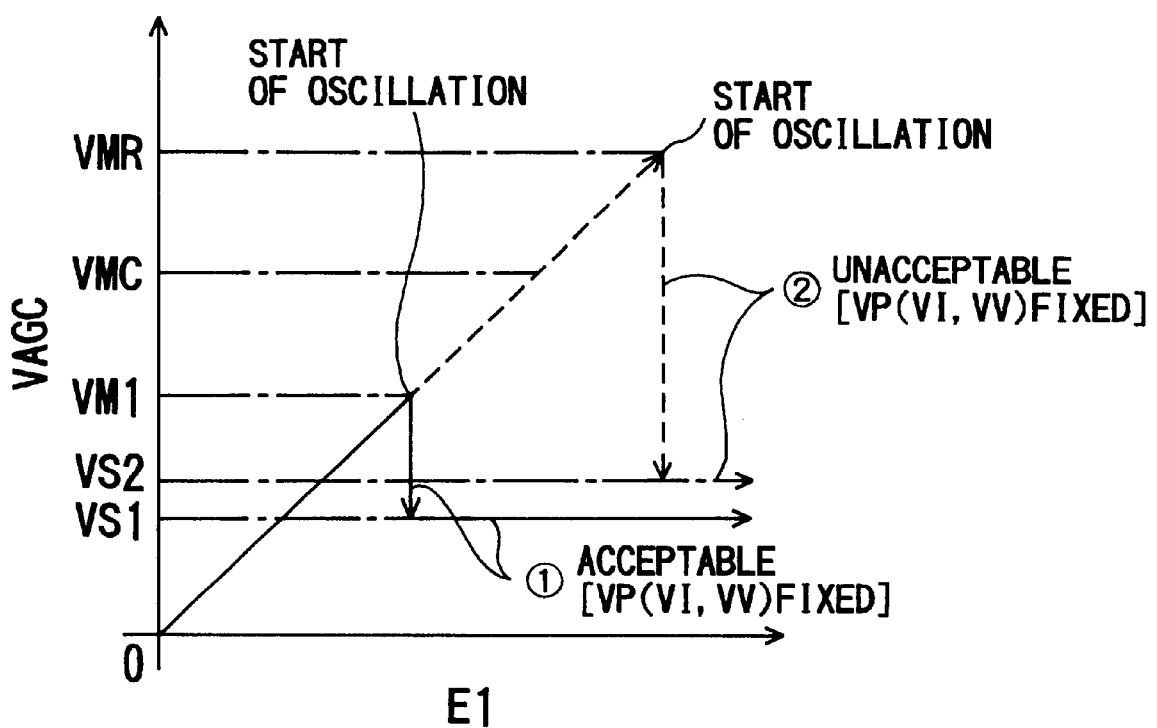
FIG. 3 is a graph for explaining an example of measurement and evaluation relating to oscillation states of the crystal oscillator in FIG. 1.

FIG. 3 is a graph explaining the measurement and evaluation of quality of a crystal unit in the above case. In FIG. 3, the horizontal axis represents the voltage of the voltage source E1 (hereinafter, this voltage is referred to as E1), and the vertical axis represents the DC input voltage VAGC provided by E1 to the AGC amplifier.

First, when E1=0, no oscillation is started, so that the DC voltage Vp (Vi, Vv) proportional to the driving power (driving current, driving voltage) of the crystal unit is equal to 0, which is inputted to one of the input terminals of the error amplifier AV2 as a differential amplifier. To the other input terminal, there is inputted the DC voltage VP (VI, VV) set at a specified value, which allows the error amplifier AV2 to output the output voltage VAV2 as a differential output that is equal to VP (VI, VV). Since VAV2 is larger than E1 (=0), a forward voltage is applied to the diode D1, which is taken as being zero. This makes the DC input voltage VAGC supplied from a connection of the resistor R2 and the diode D1 equal to E1, so that VAGC is made zero.

As E1 is increased from zero, VAGC increases with an increase in E1 with the value thereof equal to E1 until the crystal unit starts to oscillate because the DC voltage Vp (Vi, Vv) remains as zero 0 and the output voltage VAV2 is kept to be VP (VI, VV) which is larger than E1.

When the increased E1, hence VAGC, reaches a certain voltage VM1 or VM2, transient oscillation is started. Once the oscillation is started, the DC voltage Vp (Vi, Vv) is generated which is proportional to a driving power (driving current, driving voltage) of the crystal unit. This reduces VAV2 as the differential output voltage of the error amplifier AV2 to further reduce the DC input voltage VAGC from VM1 or VM2 to a certain value of VS1 or VS2 because a reverse voltage is applied to the diode D1 at this time to cut the connection from the E1. With this, the oscillation is brought from the transient state to a stable state. Here, VS1 is the DC input voltage VAGC after the start of oscillation of an acceptable crystal unit, and VS2 is that of an unacceptable crystal unit.

As explained above, the value of the driving power (driving current, driving voltage) of the crystal unit at a transition from a transient state to a stable state becomes proportional to the DC voltage VP (VI, VV) for setting the driving power, or to the detected value of the voltage Vp (Vi, Vv) of actual operation. In addition, a voltage VM2, at which an unacceptable crystal unit starts oscillation, is larger than a voltage VM1 at which an acceptable crystal unit starts oscillation. The level of VS2 sometimes becomes approximately equal to that of VS1. Both of the levels of VS1 and VS2 are determined by the conditions of the crystal oscillator and crystal unit, namely, the levels are characteristic of the crystal oscillator and crystal unit.

Therefore, it is possible to accurately evaluate quality of a crystal unit by increasing the DC input voltage VAGC with the DC voltage VP (VI, VV) being fixed, measuring the maximum value of VAGC at the start of oscillation in the crystal oscillator shown in FIG. 1, and determining whether the measured maximum value is VM1, the oscillation starting voltage characteristic of the acceptable crystal unit, or VM2, the oscillation starting voltage characteristic of the unacceptable oscillator.

In addition, the oscillation starting voltages VM1 and VM2 become larger as an increasing speed of the voltage E1 becomes faster. This is due to inertia relating to the equivalent inductance and equivalent capacitance of the crystal unit. However, the voltage levels VS1 and VS2 are not changed regardless of the increasing speed of E1. Thus, it is desirable to keep the increasing speed of E1, that is, the increasing speed of the DC input voltage VAGC, constant.

Moreover, it is not necessary for the DC input voltage VAGC (or E1) to be increased from the initial value zero, but may be from an arbitrary value less than VM1 insofar as the measurement of the maximum value thereof is accurately made.

Embodiment 2

In the Embodiment 1, the DC input voltage VAGC (or E1) is made continuously increasing. However, as shown in FIG. 3, the DC input voltage VAGC (or E1) can be set at an arbitrary voltage as an evaluation voltage VMC between the voltages VM1 and VM2. In this case, a crystal unit starting oscillation with the above set VAGC is proved to be acceptable one, which is to be brought in a stable state at the oscillation starting voltage VM1. While, a crystal unit not starting oscillation with the above set VAGC is proved to be unacceptable one, which is to be brought in a stable state at the oscillation starting voltage VM2. This allows the quality evaluation to be carried out more simply.

Embodiment 3

Figure 4:
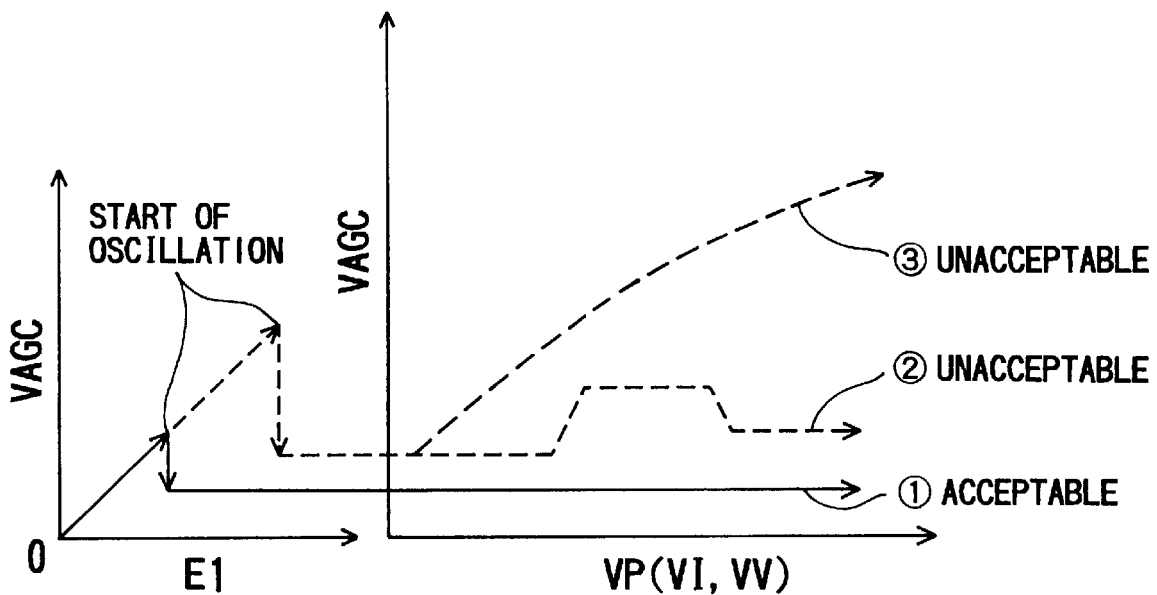
FIG. 4 is a graph for explaining an example of measurement and evaluation after a stable oscillation state of the crystal oscillator in FIG. 1.

FIG. 4 is a graph showing an example of a relationship between the DC input voltage VAGC and the DC voltage VP (VI, VV) for setting the driving power (driving current, driving voltage) of the crystal unit after the start of oscillation. The insert is a simplified FIG. 3 as a reference.

As is apparent from FIG. 4, an acceptable crystal unit ① exhibits little change in the DC input voltage VAGC to the change in the setting DC voltage VP (VI, VV). This expresses that there is little change in CI of the crystal unit. Contrary to this, unacceptable crystal units ② and ③ exhibit various changes in the DC input voltage VAGC to the change in the setting DC voltage VP (VI, VV). In general, the values of the DC input voltages VAGCs in this case become larger than that for the acceptable crystal unit.

Thus, in a stable state after the start of oscillation, with the setting DC voltage VP (VI, VV) being set at one or several points in evaluation voltage value, that is, with the driving power (or may be driving current or driving voltage) of a crystal unit being set at one or several points in evaluation power value (or may be current value or voltage value), evaluation of quality of the crystal unit can be accurately carried out by measuring, at each of the above set values, either one of the DC input voltage VAGC or oscillation frequency or both of them.

In the case of the evaluation power value being set at one point, when the measured value of the DC input voltage VAGC or frequency is the same as the value intrinsic to an acceptable crystal unit ① in stable oscillation, the crystal unit can be evaluated as being acceptable. While, when the measured value is the same as the value intrinsic to an unacceptable crystal unit ② or ③ in stable oscillation, the crystal unit can be evaluated as being unacceptable.

In the case of the evaluation power value being set at a plurality of points, when the change in the measured values of the DC input voltages VAGCs or frequencies for respective evaluation power values is the same as the change intrinsic to an acceptable crystal unit ①in stable oscillation, that is, the values are constant, the crystal unit can be evaluated as being acceptable. While, when the change in the measured values is the same as the change intrinsic to an unacceptable crystal unit ② or ③ in stable oscillation, the crystal unit can be evaluated as being unacceptable.

Embodiment 4

In the above Embodiment 3, with the driving power (or may be driving current or driving voltage) of the crystal unit being set at one or several points of evaluation power value, the DC input voltage VAGC or oscillation frequency is measured at each of the set points. On the other hand, a continuous measurement of one or both of the DC input voltage VAGC or oscillation frequency to the continuously changed DC voltage VP (VI, VV), that is, to the continuously changed driving power (may be driving current or driving voltage) of a crystal unit, may be performed in the method of the present invention, thereby to allow the quality of the crystal unit to be more efficiently evaluated. Namely, with a continuously measured value found to be constant, the crystal unit can be evaluated as being acceptable. While, with a continuously measured value being changed, the crystal unit can be evaluated as being unacceptable.

Embodiment 5

Figure 5:
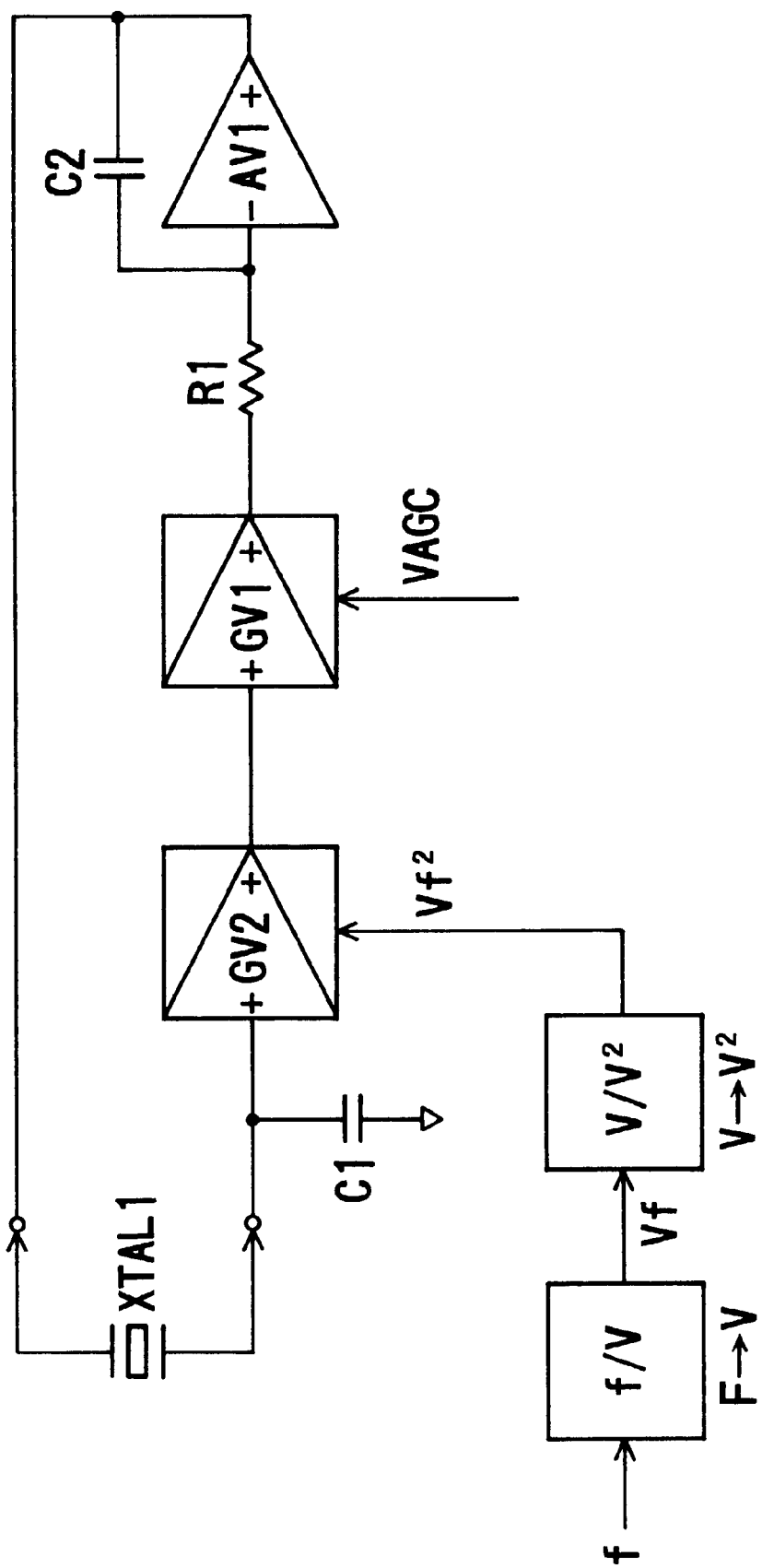
FIG. 5 is a diagram showing another example of a crystal oscillator used in the method of evaluating quality of a crystal unit according to the present invention.

FIG. 5 is a diagram showing another example of a crystal oscillator used in the method of the present invention. The oscillator is configured so that one more AGC amplifier GV2 is inserted in the previously described crystal oscillator shown in FIG. 1.

In FIG. 5, f/V is an F—V (frequency to voltage) converter; $V/V^2$ is a square multiplication circuit; f is an oscillation frequency of the crystal oscillator; Vf is a DC output voltage proportional to the oscillation frequency f; and $Vf^2$ is a DC output proportional to the square of Vf.

At the F—V converter f/V, the inputted oscillation frequency f is converted to the DC output voltage Vf proportional to the oscillation frequency f. The DC output voltage Vf is then inputted to the square multiplication circuit $V/V^2$, from which the DC output $Vf^2$ is outputted with a voltage proportional to the square of Vf and then inputted to the AGC amplifier GV2.

With the additional AGC amplifier GV2 as in FIG. 5, an influence of the oscillation frequency of the value of CI in the aforementioned equation is effectively compensated so as to allow the DC input voltage VAGC to be taken as the CI of the crystal unit driven with various frequencies.

It is to be understood that the present invention is not limited to the embodiments as explained above, but various changes and modifications in detail are possible without departing from the spirit and scope of the invention. For example, the crystal oscillator, although shown in FIGS. 1 and 5 as being provided with one and two AGC amplifiers, respectively, may have more AGC amplifiers. This, like in the above embodiments, makes it possible to measure various values necessary for evaluating quality of a crystal unit for realization of accurate quality evaluation. It is also to be understood that circuit elements other than the crystal units and AGC amplifiers are not limited to those shown in FIGS. 1 and 5. They can be changed and modified insofar as the above values for can be measured for realization of quality evaluation.

As is explained above in detail, according to the present invention, a novel method of evaluating quality of a crystal unit can be provided. The method can quantitatively measure an actual operation of a crystal unit which is to be oscillated in an actual oscillator to permit sure and accurate evaluation of the quality of the crystal unit.

What is claimed is:

1. A method of evaluating quality of a crystal unit, said method comprising:
    increasing a DC input voltage of a crystal oscillator, the crystal oscillator having at least one AGC amplifier whose amplification rate varies depending on the DC input voltage and having a crystal unit connected thereto;
    measuring a maximum value of the DC input voltage at a start of oscillation of the crystal oscillator; and
    evaluating the quality of the crystal unit by the measured maximum value of the DC input voltage.

2. The method of evaluating quality of a crystal unit as claimed in claim 1, wherein the crystal unit is evaluated as being acceptable when the measured maximum value of the DC input voltage is the same as a value intrinsic to an acceptable crystal unit, while the crystal unit is evaluated as being unacceptable when the measured maximum value of the DC input voltage is the same as a value intrinsic to an unacceptable crystal unit.

3. The method of evaluating quality of a crystal unit as claimed in claim 1, wherein the at least one AGC amplifier is a circuit whose amplification rate changes in proportion to the DC input voltage.

4. The method of evaluating quality of a crystal unit as claimed in claim 2, wherein the at least one AGC amplifier is a circuit whose amplification rate changes in proportion to the DC input voltage.

5. A method of evaluating quality of a crystal unit, said method comprising:
    setting a DC input voltage of a crystal oscillator at a specific voltage value for evaluation, the crystal oscillator having at least one AGC amplifier whose amplification rate varies depending on the DC input voltage and having a crystal unit connected thereto;
    observing whether the crystal oscillator starts oscillation or not with the DC input voltage set at the specific voltage value; and
    evaluating the quality of the crystal unit by presence or absence of start of oscillation.

6. The method of evaluating quality of a crystal unit as claimed in claim 5, wherein the specific voltage value is set at a voltage value between that intrinsic to an acceptable crystal unit and that intrinsic to an unacceptable crystal unit.

7. The method of evaluating quality of a crystal unit as claimed in claim 5, wherein the at least one AGC amplifier is a circuit whose amplification rate changes in proportion to the DC input voltage.

8. The method of evaluating quality of a crystal unit as claimed in claim 6, wherein the at least one AGC amplifier is a circuit whose amplification rate changes in proportion to the DC input voltage.

9. A method of evaluating quality of a crystal unit, said method comprising:
    setting a driving power of a crystal oscillator at a specific power value for evaluation, the crystal oscillator having at least one AGC amplifier whose amplification rate varies depending on a DC input voltage and having a crystal unit connected thereto;
    measuring, after the crystal oscillator enters a stable oscillation state, at least one of the DC input voltage and an oscillation frequency at the specific power value; and
    evaluating the quality of the crystal unit by the measured value.

10. The method of evaluating quality of a crystal unit as claimed in claim 9 wherein the specific power value is an arbitrary driving power value in the stable oscillation state, and the crystal unit is evaluated as being acceptable when the measured value at the specified power value shows a value intrinsic to an acceptable crystal unit, while the crystal unit is evaluated as being unacceptable when the measured value at the specified power value shows a value intrinsic to an unacceptable crystal unit.

11. The method of evaluating quality of a crystal unit as claimed in claim 9, wherein the at least one AGC amplifier is a circuit whose amplification rate changes in proportion to the DC input voltage.

12. The method of evaluating quality of a crystal unit as claimed in claim 10, wherein the at least one AGC amplifier is a circuit whose amplification rate changes in proportion to the DC input voltage.

13. A method of evaluating quality of a crystal unit, said method comprising:

setting a driving power of a crystal oscillator at a plurality of specific power values for evaluation, the crystal oscillator having at least one AGC amplifier whose amplification rate varies depending on a DC input voltage and having a crystal unit connected thereto;

measuring, after the crystal oscillator enters a stable oscillation state, at least one of the DC input voltage and an oscillation frequency at each of the plurality of specific power values; and evaluating the quality of the crystal unit by the measured values.

14. The method of evaluating quality of a crystal unit as claimed in claim 13, wherein each of the plurality of specific power values is an arbitrary driving power value in the stable oscillation state, and the crystal unit is evaluated as being acceptable when the measured values at the plurality of specified power values show a change intrinsic to an acceptable crystal unit, while the crystal unit is evaluated as being unacceptable when the measured values at the plurality of specified power values show a change intrinsic to an unacceptable crystal unit.

15. The method of evaluating quality of a crystal unit as claimed in claim 13, wherein the at least one AGC amplifier is a circuit whose amplification rate changes in proportion to the DC input voltage.

16. The method of evaluating quality of a crystal unit as claimed in claim 14, wherein the at least one AGC amplifier is a circuit whose amplification rate changes in proportion to the DC input voltage.

17. A method of evaluating quality of a crystal unit, said method comprising:

changing a driving power of a crystal oscillator continuously, the crystal oscillator having at least one AGC amplifier whose amplification rate varies depending on a DC input voltage and having a crystal unit connected thereto;

measuring, after the crystal oscillator enters a stable oscillation state, at least one of the DC input voltage and an oscillation frequency continuously; and evaluating the quality of the crystal unit by the continuously measured values of the at least one of the DC input voltage and the oscillation frequency.

18. The method of evaluating quality of a crystal unit as claimed in claim 17, wherein the crystal unit is evaluated as being acceptable when the continuously measured value is constant, while the crystal unit is evaluated as being unacceptable when the continuously measured value is varied.

19. The method of evaluating quality of a crystal unit as claimed in claim 17, wherein the at least one AGC amplifier is a circuit whose amplification rate changes in proportion to the DC input voltage.

20. The method of evaluating quality of a crystal unit as claimed in claim 18, wherein the at least one AGC amplifier is a circuit whose amplification rate changes in proportion to the DC input voltage.

* * * * *